(12) United States Patent
Sanders

(10) Patent No.: US 11,729,958 B1
(45) Date of Patent: Aug. 15, 2023

(54) ELECTROMAGNETIC INTERFERENCE AND/OR RADIO FREQUENCY ATTENUATING INFRASTRUCTURE INSULATION

(71) Applicant: Microsoft Technology Licensing, LLC, Redmond, WA (US)

(72) Inventor: Jesse William Sanders, Bethesda, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/814,301

(22) Filed: Jul. 22, 2022

(51) Int. Cl.
*H05K 9/00* (2006.01)
*H05K 5/06* (2006.01)

(52) U.S. Cl.
CPC ............ *H05K 9/0088* (2013.01); *H05K 5/06* (2013.01); *H05K 9/0064* (2013.01)

(58) Field of Classification Search
CPC .................................................. H05K 9/0088
See application file for complete search history.

(56) References Cited

U.S. PATENT DOCUMENTS

| | | | | |
|---|---|---|---|---|
| 4,733,013 A * | 3/1988 | Hemming | ............ | H05K 9/0001 174/373 |
| 4,980,516 A * | 12/1990 | Nakagawa | ........... | H05K 9/0015 174/358 |
| 6,239,360 B1 * | 5/2001 | Kato | .................... | H05K 9/0039 174/358 |
| 11,197,399 B2 * | 12/2021 | Carroll | .............. | E04F 15/02016 |
| 2007/0029110 A1 * | 2/2007 | Matsumoto | ............. | E04B 2/824 174/353 |

* cited by examiner

*Primary Examiner* — Hung V Ngo
(74) *Attorney, Agent, or Firm* — Ray Quinney & Nebeker P.C.; Paul N. Taylor

(57) ABSTRACT

An electromagnetically insulating device includes a body material, an electrically conductive EMI attenuation layer, and a plurality of conductive elements. The body material is substantially planar and flexible. The EMI attenuation layer is positioned inside the body material. The plurality of conductive elements are positioned in the body material. The EMI attenuation layer and the plurality of conductive elements are configured to be electrically connected to an external ground connection.

20 Claims, 4 Drawing Sheets

ELECTROMAGNETIC INTERFERENCE AND/OR RADIO FREQUENCY ATTENUATING INFRASTRUCTURE INSULATION

BACKGROUND

Background and Relevant Art

Electronic devices (such as computing devices, power supplies, and data storage devices) are susceptible to electromagnetic interference (EMI) and radiate Radio Frequency (RF) emanations that can be detected by other electronic devices including an antenna or another communication device in proximity to the electronic devices. Privacy and security concerns may require EMI and RF shielding when using some electronic devices.

BRIEF SUMMARY

In some embodiments, an electromagnetically insulating device includes a body material, an electrically conductive EMI attenuation layer, and a plurality of conductive elements. The body material is substantially planar and flexible. The EMI attenuation layer is positioned inside the body material. The plurality of conductive elements are positioned in the body material. The EMI attenuation layer and the plurality of conductive elements are configured to be electrically connected to an external ground connection.

In some embodiments, a system for electromagnetic attenuation includes a first electromagnetically insulating device including a first EMI attenuation layer, a second electromagnetically insulating device including a second EMI attenuation layer, and a connection device electrically connecting the first EMI attenuation layer to the second EMI attenuation layer.

In some embodiments, an electromagnetically insulating device includes a body material, a first electrically conductive EMI attenuation layer, a second electrically conductive EMI attenuation layer, and a plurality of conductive elements. The body material is substantially planar and flexible. The first EMI attenuation layer is positioned inside the body material. The second EMI attenuation layer is positioned inside the body material. The plurality of conductive elements are positioned in the body material. The first EMI attenuation layer, the second EMI attenuation layer, and the plurality of conductive elements are configured to be electrically connected to an external ground connector.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 4-1 is a top view of a conductive anchoring device, according to at least one embodiment of the present disclosure;

FIG. 4-2 is a side view of the conductive anchoring device of FIG. 4-1;

DETAILED DESCRIPTION

The present disclosure relates generally to systems and methods for electromagnetic interference (EMI) and/or radio frequency (RF) shielding. More particularly, the electromagnetically insulating devices described herein are configured to provide EMI or RF shielding for a computing device or another electronic device inside a structure, such as a datacenter, an office building, a residential home, a research facility, etc. In some embodiments, electromagnetically insulating devices according to the present disclosure are configured to provide waterproofing or other environmental insulation in addition to the EMI and/or RF shielding.

Figure 1:
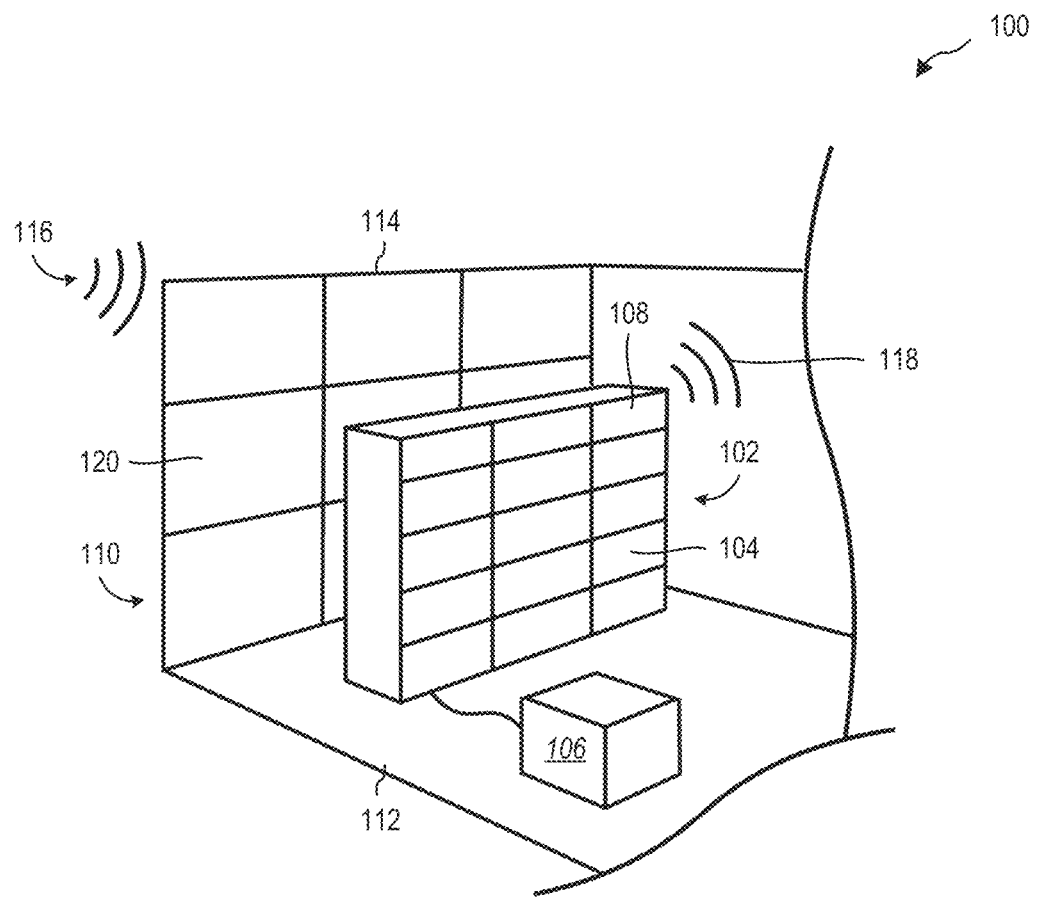
FIG. 1 is an example of a datacenter with electromagnetic radiation, according to at least one embodiment of the present disclosure.

FIG. 1 is an embodiment of a datacenter 100 including a server rack 102 containing electronic devices such as computing devices 104, power supplies 106, communication devices 108 (such as network switches), and other electronic devices. In some embodiments, the datacenter 100 includes other electronic devices in other server racks or in stand-alone devices. The datacenter 100 includes walls 110, a floor 112, a ceiling/roof 114, and other structural components to enclose and protect the server rack 102 and/or other electronic devices from environmental effects, such as precipitation, temperature, wind, dirt, debris, and other adverse environmental effects that may adversely impact the performance and/or operational lifetime of the electronic devices. The walls 110, floor 112, ceiling/roof 114, and other structural components of the datacenter 100, in some embodiments, further attenuate EM radiation that would otherwise enter or exit the datacenter through the walls 110, the floor 112, the ceiling/roof 114, and other structural components.

While a datacenter is described in relation to FIG. 1, in other embodiments, embodiments of electromagnetically insulating devices described herein are applicable to other structures including an office building, a residential home, a research facility, etc.

The electronic devices of the datacenter 100 may be susceptible to EMI 116. The electromagnetically insulating device 120 may attenuate EMI 116 and/or prevent EMI 116 from passing through the electromagnetically insulating device 120 and affecting the electronic devices. The electronic devices of the datacenter 100 may produce RF signals 118.

In some embodiments, an electromagnetically insulating device 120 is positioned in or on (e.g., on an outside surface or an inside surface) the walls 110, floor 112, ceiling/roof 114, and other structural components of the datacenter 100 to attenuate the EM radiation through the walls 110, floor 112, ceiling/roof 114, and other structural components and at least partially insulate the electronic devices of the datacenter 100 and the external environment.

By electromagnetically insulating a datacenter or other structure, the electronic devices therein, in at least one embodiment described herein, are protected from external interference and the RF signals produced by the electronic devices are contained such that external electronic devices cannot receive and/or interpret the RF signals. Conventional EM insulation includes electrically conductive material that may be rigid, heavy, fragile, or easily corroded, such as copper plates or aluminum sheets. Conventional EM insulation can be difficult to install, modify, and remove, which limits the adaptability of the datacenter 100 as the demands and/or equipment of the datacenter 100 change over time. Further, conventional EM insulation can be difficult to retrofit on existing structures. Conventional EM insulation can be difficult to maintain, as well, as the EM radiation attenuation performance can degrade as the EM insulation corrodes.

In some embodiments, an electromagnetically insulating device 120 according to the present disclosure includes a modular, flexible, durable panel that is configured to provide both EM and environmental insulation. In some embodiments, the electromagnetically insulating devices 120 include connectors to electrically couple a series of electromagnetically insulating devices 120 to one another to cover or partially cover the walls 110, floor 112, ceiling/roof 114, or other structural components, whether indoors or outdoors, of the datacenter 100 to attenuate the EM radiation through the walls 110, floor 112, ceiling/roof 114, and other structural components and at least partially insulate the electronic devices of the datacenter 100 and the external environment.

Figure 2:
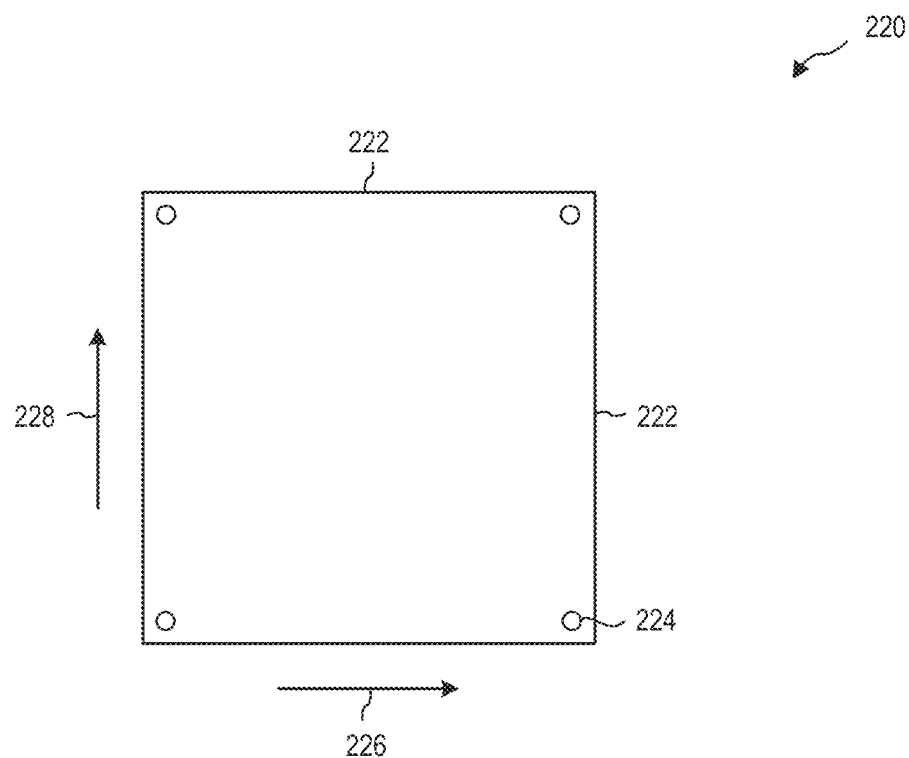
FIG. 2 is a top view of an electromagnetically insulating device, according to at least one embodiment of the present disclosure.

FIG. 2 is a top view of an embodiment of an electromagnetically insulating device 220 that may be used in a datacenter or other structure, such as described in relation to FIG. 1. In some embodiments, the electromagnetically insulating device 220 is substantially rectangular. In some embodiments, the electromagnetically insulating device 220 has a perimeter shape in plan view that allows for tiling of the electromagnetically insulating device 220. For example, the electromagnetically insulating device 220 may be triangular, hexagonal, or other shape that allows for tiling of the electromagnetically insulating devices 220 in a substantially continuous plane along edges 222 of the electromagnetically insulating devices 220 without gaps therebetween. In some embodiments, the electromagnetically insulating devices 220 are configured to overlap such that the electromagnetically insulating devices 220 provide a substantially continuous plane. For example, the electromagnetically insulating device 220 may be circular and, when overlapped in a hexagonal arrangement, the circular electromagnetically insulating devices 220 create a substantially continuous plane.

In some embodiments, the electromagnetically insulating device 220 includes a plurality of connectors 224. The connectors 224 may facilitate tiling of the electromagnetically insulating devices 220 by connection to walls, floor, ceiling/roof, or other structural components of the datacenter or other structure. For example, the connectors may be arranged and/or positioned to align the connectors with one or more features of the structure in which the electromagnetically insulating device 220 is installed. In some examples, the connectors 224 may be positioned at no more than 18-inch intervals to simplify installation in walls of a building. In some embodiments, the connectors 224 provide an electrical coupling from an electrically conductive layer in or on the electromagnetically insulating device 220 to an external ground connection, such an earth ground or earth ground wire. The electromagnetically insulating device 220 includes at least one electrically conductive layer or electrically conductive material in the electromagnetically insulating device 220 that allows electrical conductivity through the plane of the electromagnetically insulating device 220. In some embodiments, the electromagnetically insulating device 220 allows electrical conductivity in the plane of the electromagnetically insulating device 220 in a first direction 226. In some embodiments, the electromagnetically insulating device 220 allows electrical conductivity in the plane of the electromagnetically insulating device 220 in a second direction 228 orthogonal to the first direction. In some embodiments, the electromagnetically insulating device 220 allows electrical conductivity in the plane of the electromagnetically insulating device 220 in a first direction 226 and in a second direction 228 orthogonal to the first direction.

Figure 3:
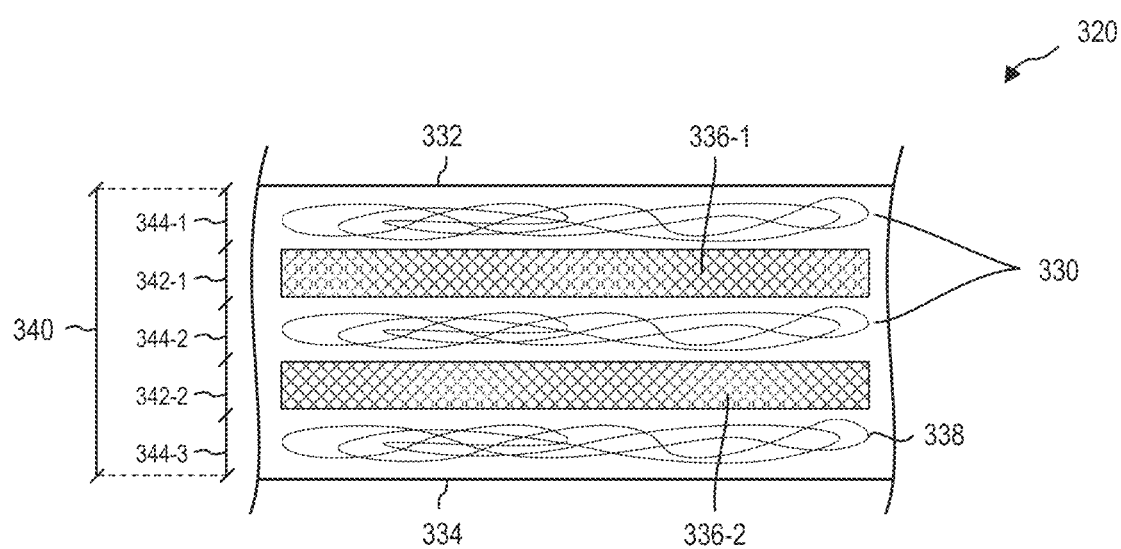
FIG. 3 is a cross-sectional side view of an electromagnetically insulating device, according to at least one embodiment of the present disclosure.

FIG. 3 is a cross-sectional side view of an embodiment of an electromagnetically insulating device 320. The electromagnetically insulating device 320 includes a body material 330. The body material 330 may be planar and/or flexible.

In some embodiments, the body material 330 is watertight, preventing water from passing from a first side 332 of the electromagnetically insulating device 320 to a second side 334 of the electromagnetically insulating device 320. A watertight body material 330 may allow the electromagnetically insulating device 320 to be exposed to environmental humidity and/or precipitation while forming a moisture barrier for the structure in which the electromagnetically insulating device 320 is installed. In some embodiments, a watertight body material 330 can cover and/or encapsulate an electrically conductive EMI attenuation layer 336-1, 336-2 and limit or prevent corrosion of the electrically conductive material of the EMI attenuation layer 336-1, 336-2.

In some embodiments, the body material 330 is airtight, preventing air or at least some gases from passing from a first side 332 of the electromagnetically insulating device 320 to a second side 334 of the electromagnetically insulating device 320. A watertight body material 330 may allow the electromagnetically insulating device 320 to be exposed to environmental humidity and/or precipitation while forming a moisture barrier for the structure in which the electromagnetically insulating device 320 is installed. In some embodiments, a watertight body material 330 can cover and/or encapsulate an electrically conductive EMI attenuation layer 336-1, 336-2 and limit or prevent corrosion of the electrically conductive material of the EMI attenuation layer 336-1, 336-2.

In some embodiments, the body material 330 is or includes an electrically insulating material. For example, the body material 330 is or includes a vinyl material, a rubber material (natural or synthetic), a polymer material, or other flexible non-conductive materials. In some embodiments, the body material 330 is positioned on and/or adhered to each EMI attenuation layer 336-1, 336-2. For example, the EMI attenuation layer 336-1, 336-2 may be a continuous foil or sheet with no channels or pores. The body material 330 may include a plurality of layers that are separated by the EMI attenuation layer(s) 336-1, 336-2. In some embodiments, the body material 330 is monolithic through the channels or pores of the mesh of the EMI attenuation layers 336-1, 336-2. For example, the body material 330 may be continuous from a first side of a mesh EMI attenuation layer 336-1, 336-2 to a second side of the EMI attenuation layer 336-1, 336-2.

In some embodiments, the EMI attenuation layer 336-1, 336-2 has a resistance of no more than 5 Ohms to the connector (such as connectors 224 described in relation to FIG. 2). In some embodiments, the EMI attenuation layer 336-1, 336-2 has a resistance of no more than 10 Ohms to the connector. In some embodiments, the EMI attenuation layer 336-1, 336-2 has a resistance of no more than 15 Ohms to the connector.

In some embodiments, an electrically conductive EMI attenuation layer 336-1, 336-2 of the electromagnetically insulating device 320 is a mesh containing a plurality of pores or channels therethrough from a first side to a second side. In some embodiments, a pore or channel through the electrically conductive EMI attenuation layer 336-1, 336-2 according to the present disclosure has a transverse cross-section (i.e., shape) that is square, rectangular, triangular, other regular polygonal, non-regular polygonal, circular, elliptical, other regular curved shapes, irregular curved shapes, or combinations thereof. The maximum transverse dimension of the pore or channel is the transverse dimension that is greatest, irrespective of rotational orientation relative to a perpendicular direction perpendicular to a plane of the electrically conductive EMI attenuation layer 336-1, 336-2.

For example, the EM shielding for a Faraday-style shield is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday-style shield operates by balancing the electrical fields on either side of the shield. A substantially continuous Faraday shield allows the free conduction of electrical charge within the walls of the Faraday shield and becomes a hollow conductor. Introducing an aperture into the Faraday shield allows the leakage of EM radiation through the aperture. For the Faraday cage to function as such, the aperture size must be smaller than the wavelength of the interest. By layering the electrically conductive EMI attenuation layers 336-1, 336-2 in the body of the electromagnetically insulating device, the pores or channels of the conductive layers of the electrically conductive EMI attenuation layers 336-1, 336-2 may be misaligned, further reducing the effective size of the channels through the electromagnetically insulating device.

In some embodiments, the EMI attenuation of the electromagnetically insulating device 320 may be further increased by electrically conductive elements 338 positioned in the body material 330 between or around the electrically conductive EMI attenuation layer 336-1, 336-2. In some embodiments, the electrically conductive elements 338 are embedded in the body material 330 and allow electrical conductivity in the plane of the electromagnetically insulating device 320. In some embodiments, the electrically conductive elements 338 are embedded in the body material 330 and contact one or more of the electrically conductive EMI attenuation layers 336-1, 336-2. In at least one embodiment, the electrically conductive elements 338 are embedded in the body material 330 and contact at least two of the electrically conductive EMI attenuation layers 336-1, 336-2 to allow electrical conductivity between the electrically conductive EMI attenuation layers 336-1, 336-2.

In some embodiments, the electrically conductive elements 338 include electrically conductive fibers. In some embodiments, the electrically conductive elements 338 include electrically conductive rods. In some embodiments, the electrically conductive elements 338 include electrically conductive threads.

In some embodiments, as the quantity of the electrically conductive EMI attenuation layer 336-1, 336-2 is increased, the electromagnetically insulating device 320 offers additional attenuation for EM radiation wavelengths smaller than the channel size, as the EM radiation must pass through each of the aligned or misaligned channels in the mesh(es) to leak from the electromagnetically insulating device 320. For example, attenuation may be controlled by the grounding of the electromagnetically insulating device 320, distance and/or position of the electronic device(s) relative to the electromagnetically insulating device 320, electromagnetically insulating device configuration, the maximum transverse dimension and longitudinal dimension of the channels, quantity of the channels, frequency, other factors, or combinations thereof.

In some embodiments, the electromagnetically insulating device 320 provides at least −60 dB of attenuation from 100 MHz through 18 GHz. In some embodiments, an electromagnetically insulating device 320 according to the present disclosure attenuates EMI in a frequency range of 2.2 GHz to 2.6 GHz. In other embodiments, an electromagnetically insulating device 320 attenuates EMI in a frequency range of 800 MHz to 900 MHz. In further embodiments, an electromagnetically insulating device 320 attenuates EMI in a frequency range of 1.8 GHz to 2.0 GHz. In yet further embodiments, an electromagnetically insulating device 320 attenuates EMI in a frequency range of 5.0 GHz to 6.0 GHz.

In some embodiments, an electrically conductive EMI attenuation layer 336-1, 336-2 provides at least −60 dB of RF attenuation from 9 kHz to 18 GHz. In some embodiments, an electrically conductive EMI attenuation layer 336-1, 336-2 according to the present disclosure attenuates EMI in a frequency range of 2.2 GHz to 2.6 GHz. In other embodiments, an electrically conductive EMI attenuation layer 336-1, 336-2 attenuates EMI in a frequency range of 800 MHz to 900 MHz. In further embodiments, an electrically conductive EMI attenuation layer 336-1, 336-2 attenuates EMI in a frequency range of 1.8 GHz to 2.0 GHz. In yet further embodiments, an electrically conductive EMI attenuation layer 336-1, 336-2 attenuates EMI in a frequency range of 5.0 GHz to 6.0 GHz.

In some embodiments, an electromagnetically insulating device 320 according to the present disclosure attenuates EMI in the frequency range by at least 20 dB throughout the frequency range. In other embodiments, an electromagnetically insulating device 320 attenuates EMI in the frequency range by at least 30 dB throughout the frequency range. In yet other embodiments, an electromagnetically insulating device 320 attenuates EMI in the frequency range by at least 60 dB throughout the frequency range.

In some embodiments, an electromagnetically insulating device 320 according to the present disclosure attenuates EMI in the frequency range by an average of at least 20 dB across the frequency range. In other embodiments, an electromagnetically insulating device 320 attenuates EMI in the frequency range by an average of at least 30 dB across the frequency range. In yet other embodiments, an electromagnetically insulating device 320 attenuates EMI in the frequency range by an average of at least 60 dB across the frequency range.

In some embodiments, the electrically conductive EMI attenuation layer(s) 336-1, 336-2 includes an electrically conductive material. Examples of suitable materials include, but are not limited to copper, aluminum, iron, tin, magnesium, ferrite or alloys thereof; graphite; and electrically conductive polymers.

In at least one embodiment, an electromagnetically insulating device 320 includes copper to provide both electrical conductivity and flexibility. In another embodiment, an electromagnetically insulating device 320 includes aluminum to provide both electrical conductivity and flexibility. In yet another embodiment, an electromagnetically insulating device 320 includes a combination of copper in a first portion and aluminum in a second portion to provide different electrical conductivity properties in the different portions.

In some embodiments, the first EMI attenuation layer 336-1 and the second EMI attenuation layer 336-2 are the same. In some embodiments, the first EMI attenuation layer 336-1 and the second EMI attenuation layer 336-2 are different. For example, the first EMI attenuation layer 336-1 and the second EMI attenuation layer 336-2 may include or be made of different materials. In another example, the first EMI attenuation layer 336-1 and the second EMI attenuation layer 336-2 may have different porosities, such as the first EMI attenuation layer 336-1 being a mesh and the second EMI attenuation layer 336-2 being a substantially continuous sheet. In yet another example, the first EMI attenuation layer 336-1 and the second EMI attenuation layer 336-2 may have different channel or pore geometries, such as different sizes, shapes, aspect ratios, etc.

The positioning of the EMI attenuation layers 336-1, 336-2 may have equal spacing within the electromagnetically insulating device 320 between the first side 332 and the second side 334. In some embodiments, a total thickness 340 of the electromagnetically insulating device 320 of at least 8 millimeters (mm) allows sufficient electrical separation between the first EMI attenuation layer 336-1 and the second EMI attenuation layer 336-2. In some embodiments, the electromagnetically insulating device 320 has a total thickness 340 of at least 10 mm. In some embodiments, the electromagnetically insulating device 320 has a total thickness 340 of at least 12.7 mm.

In some embodiments, an EMI attenuation layer 336-1, 336-2 has an EMI attenuation layer thickness 342-1, 342-2 of at least 0.015 mm. For example, an EMI attenuation layer 336-1, 336-2 may be a mesh with a wire diameter of 0.015 mm. In a single layer of the EMI attenuation layer 336-1, 336-2, the mesh has an EMI attenuation layer thickness 342-1, 342-2 of 0.015 mm. In other embodiments, the EMI attenuation layer 336-1, 336-2 has an EMI attenuation layer thickness 342-1, 342-2 of at least 0.10 mm. In some examples, increasing the EMI attenuation layer thickness 342-1, 342-2 may provide for a EMI attenuation layer 336-1, 336-2 with greater electrical conductivity, but the EMI attenuation layer thickness 342-1, 342-2 may be less flexible.

In some embodiments, a body layer thickness 344-1, 344-2, 344-3 of the body material 330 between or around the EMI attenuation layer(s) 336-1, 336-2 allows flexibility of the electromagnetically insulating device 320. A second body layer thickness 344-2 between the EMI attenuation layers, such as between the first EMI attenuation layer 336-1 and the second EMI attenuation layer 336-2, provides a separation between EMI attenuation layers to further aide in EMI attenuation. In some embodiments, body layer thickness 344-1, 344-2, 344-3 is at least 2.5 mm. In some embodiments, at least a second body layer thickness 344-2 is no less than 2.5 mm to provide a 2.5 mm separation between the first EMI attenuation layer 336-1 and the second EMI attenuation layer 336-2.

In some embodiments, one or more of the EMI attenuation layers 336-1, 336-2 may be substantially parallel to a plane (e.g., through a major dimension) of the body material 330.

Figures 1, 4:
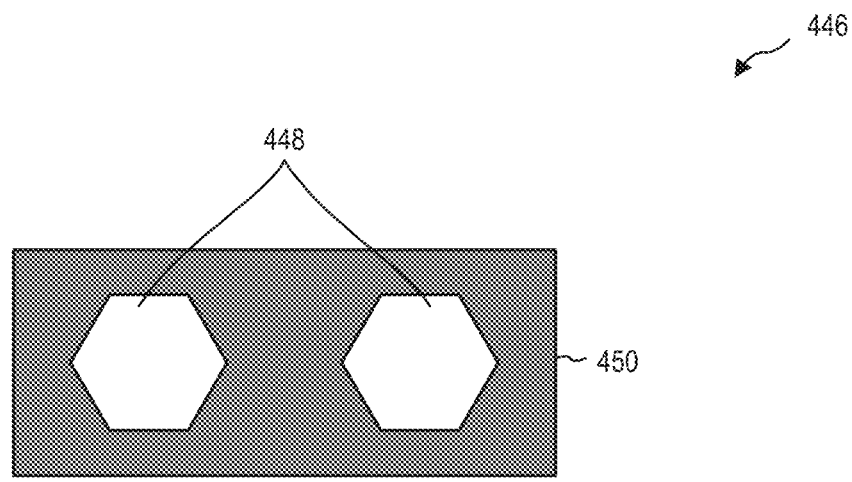
Figures 2, 4:
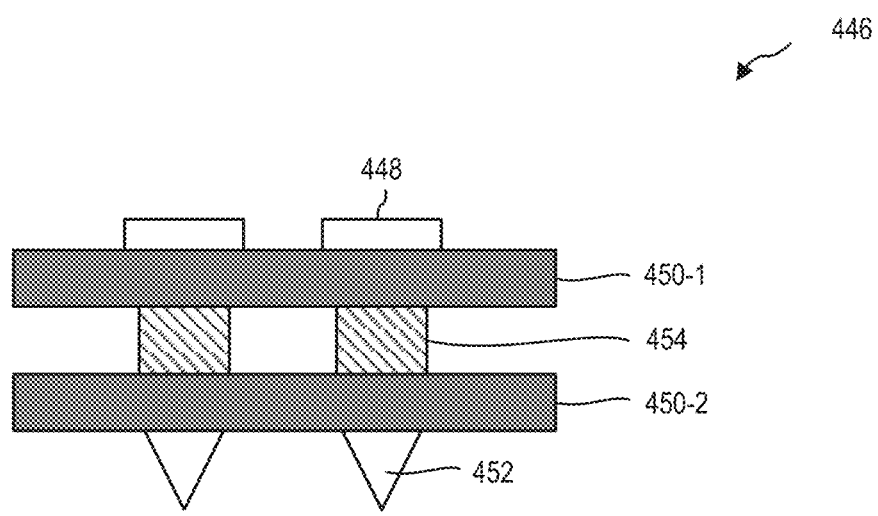

FIG. 4-1 and FIG. 4-2 are a top view and a side view of a connection device 446, respectively. A connection device 446 may allow connection of an electromagnetically insulating device, such as any of the embodiments described herein, to a structural element of a structure (e.g., a wall, floor, ceiling, roof, etc.) and/or to another electromagnetically insulating device. For example, the connection device 446 includes a conductive fastener 448 that provides an electrically conductive path from an EMI attenuating layer of the electromagnetically insulating device to an external electrical ground connection. In some embodiments, the external electrical ground connection is provided by a wire that provides an electrically conductive path from the connection device to an earth ground. In some embodiments, the external electrical ground connection is provided through a second electromagnetically insulating device that is coupled to an earth ground or other electrical ground connection.

In some embodiments, the connection device 446 includes a brace 450-1, 450-2. In some embodiments, the brace 450-1, 450-2 distributes compressive force from the conductive fastener 448 across at least a portion of an electromagnetically insulating device to prevent and/or limit damage to the electromagnetically insulating device compressed by the brace 450-1, 450-2. In some embodiments, a first brace 450-1 and a second brace 450-2 compress one or more electromagnetically insulating devices between the braces 450-1, 450-2. In some embodiments, the connection device 446 includes a first brace 450-1 to compress the electromagnetically insulating device against a structural element such as a stud or to a concrete wall of a structure.

The conductive fastener 448, in some embodiments, includes a penetrative tip 452 that allows the conductive fastener 448 to penetrate into a structural element of a structure or into a second brace 450-2. In some embodiments, a threaded connection 454 of the conductive fastener 448 allows torque on the conductive fastener to apply a compressive force to the brace(s) 450-1, 450-2 by compressing the first brace 450-1 toward the second brace 450-2 or be compressing the first brace 450-1 against a structural element.

Figure 5:
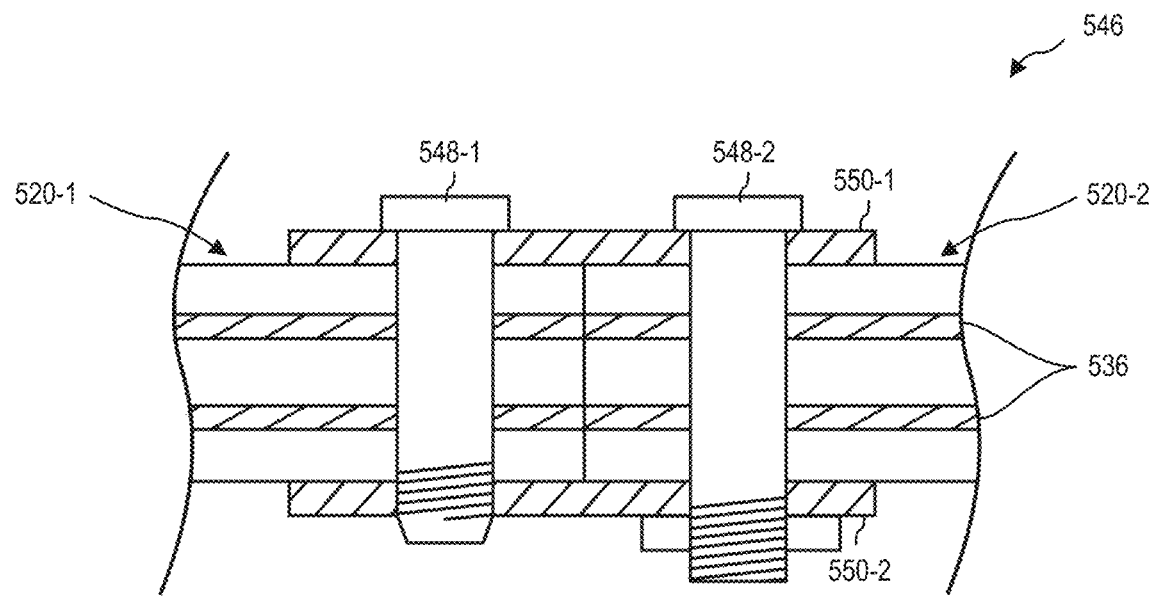
FIG. 5 is a cross-sectional side view of a conductive connection device securing a first electromagnetically insulating device to a second electromagnetically insulating device, according to at least one embodiment of the present disclosure.

FIG. 5 is a side cross-sectional view of another embodiment of a connection device 546 with non-penetrative tips. In some embodiment, the connection device 546 includes an external brace 550-1, 550-2 that is positioned on either side of the electromagnetically insulating devices 520-1, 520-2 to connect the electromagnetically insulating devices 520-1, 520-2 to one another. As described herein, the conductive fasteners 548 of the connection device 546 may allow electrical conduction between the EMI attenuating layer(s) 536 of a first electromagnetically insulating device 520-1 to the EMI attenuating layer(s) 536 of a second electromagnetically insulating device 520-2. In some embodiments, the brace(s) 550-1, 550-2 are electrically conductive to provide a conductive path between a first conductive fastener 548-1 coupled to the first electromagnetically insulating device 520-1 and a second conductive fastener 548-2 coupled to the second electromagnetically insulating device 520-2.

Figure 6:
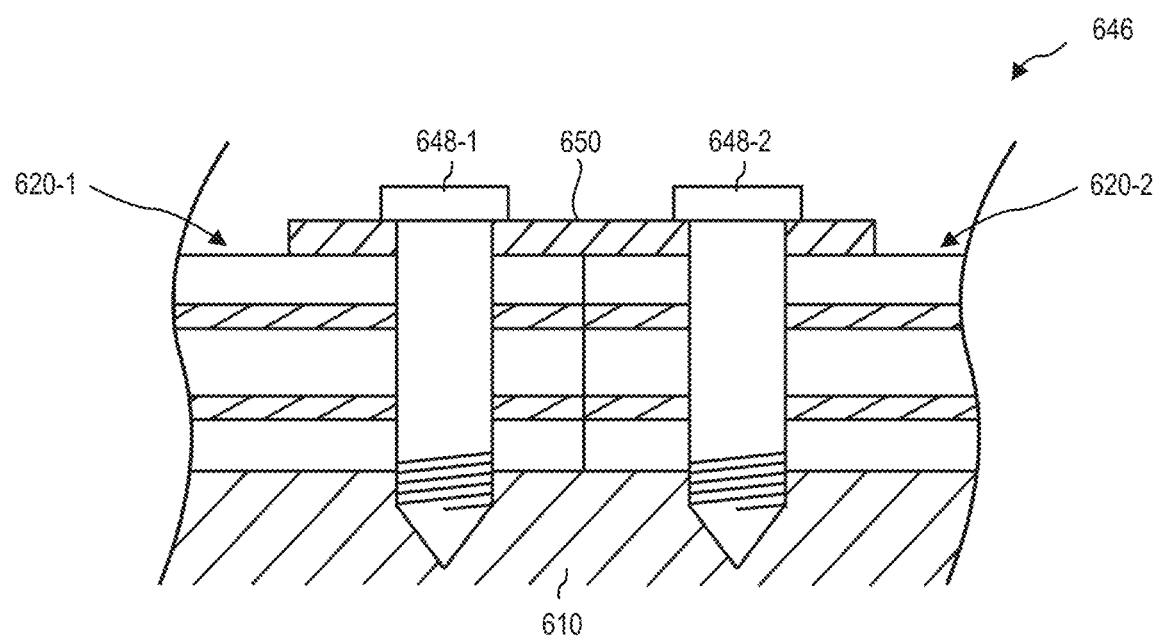
FIG. 6 is a cross-sectional side view of a conductive connection device securing a first electromagnetically insulating device and a second electromagnetically insulating device to a wall, according to at least one embodiment of the present disclosure.

FIG. 6 is a side cross-sectional view of another embodiment of a connection device 646. The connection device 646 includes, in some embodiments, a brace 650 that provides a conductive path between a first conductive fastener 648-1 connected to a first electromagnetically insulating device 620-1 and a second conductive fastener 648-2 connected to a second electromagnetically insulating device 620. In some embodiments, the conductive fasteners 648-1, 648-2 compress the brace 650 (and the electromagnetically insulating devices 620-1, 620-2) against a structural element, such as a wall 610.

In some embodiments, an electromagnetically insulating device according to the present disclosure can allow the use of modular systems to electromagnetically insulate buildings such as datacenters from EMI and RF communications, making more sites available and modification of existing sites simpler.

INDUSTRIAL APPLICABILITY

The present disclosure relates generally to systems and methods for electromagnetic interference (EMI) or radio frequency (RF) shielding. More particularly, the electromagnetically insulating devices described herein are configured to provide EMI or RF shielding for a computing device or another electronic device inside a structure, such as a datacenter, an office building, a residential home, a research facility, etc. In some embodiments, electromagnetically insulating devices according to the present disclosure that are configured to provide waterproofing or other environmental insulation in addition to the EMI and RF shielding.

In some embodiments, a datacenter includes a server rack containing electronic devices such as computing devices, power supplies, communication devices (such as network switches), and other electronic devices. In some embodiments, the datacenter includes other electronic devices in other server racks or in standalone devices. The datacenter includes walls, a floor, a ceiling/roof, and other structural components to enclose and protect the server rack and/or other electronic devices from environmental effects, such as precipitation, temperature, wind, dirt, debris, and other adverse environmental effects that may adversely impact the performance and/or operational lifetime of the electronic devices. The walls, floor, ceiling/roof, and other structural components of the datacenter, in some embodiments, further attenuate EM radiation that would otherwise enter or exit the datacenter through the walls, a floor, a ceiling/roof, and other structural components.

While a datacenter is described herein, in other embodiments, embodiments of electromagnetically insulating devices described herein are applicable to other structures including an office building, a residential home, a research facility, etc.

The electronic devices of the datacenter may be susceptible to EMI. The electromagnetically insulating device may attenuate EMI and/or prevent EMI from passing through the electromagnetically insulating device and affecting the electronic devices. The electronic devices of the datacenter may produce RF signals.

In some embodiments, an electromagnetically insulating device is positioned in or on the walls, floor, ceiling/roof, and other structural components of the datacenter to attenuate the EM radiation through the walls, floor, ceiling/roof, and other structural components and at least partially insulate the electronic devices of the datacenter and the external environment.

By electromagnetically insulating a datacenter or other structure, the electronic devices therein are protected from external interference and the RF signals produced by the electronic devices are contained such that external electronic devices cannot receive and/or interpret the RF signals. Conventional EM insulation includes electrically conductive material that may be rigid, heavy, fragile, or easily corroded, such as copper plates or aluminum sheets. Conventional EM insulation can be difficult to install, modify, and remove, which limits the adaptability of the datacenter as the demands and equipment of the datacenter change over time. Further, conventional EM insulation can be difficult to retrofit on existing structures. Conventional EM insulation can be difficult to maintain, as well, as the EM radiation attenuation performance can degrade as the EM insulation corrodes.

In some embodiments, an electromagnetically insulating device according to the present disclosure includes a modular, flexible, durable panel that is configured to provide both EM and environmental insulation. In some embodiments, the electromagnetically insulating devices include connectors to electrically couple a series of electromagnetically insulating devices to one another to cover or partially cover the walls, floor, ceiling/roof, or other structural components of the datacenter to attenuate the EM radiation through the walls, floor, ceiling/roof, and other structural components and at least partially insulate the electronic devices of the datacenter and the external environment.

In some embodiments, an electromagnetically insulating device is used in a datacenter or other structure, such as described herein. In some embodiments, the electromagnetically insulating device is substantially rectangular. In some embodiments, the electromagnetically insulating device has a perimeter shape in plan view that allows for tiling of the electromagnetically insulating device. For example, the electromagnetically insulating device may be triangular, hexagonal, or other shape that allows for tiling of the electromagnetically insulating devices in a substantially continuous plane along edges of the electromagnetically insulating devices without gaps therebetween. In some embodiments, the electromagnetically insulating devices are configured to overlap such that the electromagnetically insulating devices provide a substantially continuous plane. For example, the electromagnetically insulating device 220 may be circular and, when overlapped in a hexagonal arrangement, the circular electromagnetically insulating devices create a substantially continuous plane.

In some embodiments, the electromagnetically insulating device includes a plurality of connectors. The connectors may facilitate tiling of the electromagnetically insulating devices by connection to walls, floor, ceiling/roof, or other structural components of the datacenter or other structure. For example, the connectors may be arranged and/or positioned to align the connectors with one or more features of the structure in which the electromagnetically insulating device is installed. In some examples, the connectors may be positioned at no more than 18-inch intervals to simplify installation in walls of a building. In some embodiments, the connectors provide an electrical coupling from an electrically conductive layer in or on the electromagnetically insulating device to an external ground connection, such an earth ground or earth ground wire. The electromagnetically insulating device includes at least one electrically conductive layer or electrically conductive material in the electromagnetically insulating device that allows electrical conductivity through the plane of the electromagnetically insulating device. In some embodiments, the electromagnetically insulating device allows electrical conductivity in the plane of the electromagnetically insulating device in a first direction. In some embodiments, the electromagnetically insulating device allows electrical conductivity in the plane of the electromagnetically insulating device in a second direction orthogonal to the first direction. In some embodiments, the electromagnetically insulating device allows electrical conductivity in the plane of the electromagnetically insulating device in a first direction and in a second direction orthogonal to the first direction.

In some embodiments, the electromagnetically insulating device includes a body material that is flexible. In some embodiments, the body material is watertight, preventing water from passing from a first side of the electromagnetically insulating device to a second side of the electromagnetically insulating device. A watertight body material may allow the electromagnetically insulating device to be exposed to environmental humidity and/or precipitation while forming a moisture barrier for the structure in which the electromagnetically insulating device is installed. In some embodiments, a watertight body material can cover and/or encapsulate an electrically conductive EMI attenuation layer and limit or prevent corrosion of the electrically conductive material of the EMI attenuation layer.

In some embodiments, the body material is airtight, preventing air or at least some gases from passing from a first side of the electromagnetically insulating device to a second side of the electromagnetically insulating device. A watertight body material may allow the electromagnetically insulating device to be exposed to environmental humidity and/or precipitation while forming a moisture barrier for the structure in which the electromagnetically insulating device is installed. In some embodiments, a watertight body material can cover and/or encapsulate an electrically conductive EMI attenuation layer and limit or prevent corrosion of the electrically conductive material of the EMI attenuation layer.

In some embodiments, the body material is or includes an electrically insulating material. For example, the body material is or includes a vinyl material, a rubber material (natural or synthetic), a polymer material, or other flexible non-conductive materials. In some embodiments, the body material is positioned on and/or adhered to each EMI attenuation layer. For example, the EMI attenuation layer may be a continuous foil or sheet with no channels or pores. The body material may include a plurality of layers that are separated by the EMI attenuation layer(s). In some embodiments, the body material is monolithic through the channels or pores of the mesh of the EMI attenuation layers. For example, the body material may be continuous from a first side of a mesh EMI attenuation layer to a second side of the EMI attenuation layer.

In some embodiments, the EMI attenuation layer has a resistance of no more than 5 Ohms to the connector (such as connectors described herein). In some embodiments, the EMI attenuation layer has a resistance of no more than 10 Ohms to the connector. In some embodiments, the EMI attenuation layer has a resistance of no more than 15 Ohms to the connector.

In some embodiments, an electrically conductive EMI attenuation layer of the electromagnetically insulating device is a mesh containing a plurality of pores or channels therethrough from a first side to a second side. In some embodiments, a pore or channel through the electrically conductive EMI attenuation layer according to the present disclosure has a transverse cross-section (i.e., shape) that is square, rectangular, triangular, other regular polygonal, non-regular polygonal, circular, elliptical, other regular curved shapes, irregular curved shapes, or combinations thereof. The maximum transverse dimension of the pore or channel is the transverse dimension that is greatest, irrespective of rotational orientation relative to a perpendicular direction perpendicular to a plane of the electrically conductive EMI attenuation layer.

For example, the EM shielding of a Faraday-style shield is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday-style shield operates by balancing the electrical fields on either side of the shield. A substantially continuous Faraday shield allows the free conduction of electrical charge within the walls of the Faraday shield and becomes a hollow conductor. Introducing an aperture into the Faraday shield allows the leakage of EM radiation through the aperture. For the Faraday cage to function as such, the aperture size must be smaller than the wavelength of the interest. By layering the electrically conductive EMI attenuation layers in the body of the electromagnetically insulating device, the pores or channels of the conductive layers of the electrically conductive EMI attenuation layers may be misaligned, further reducing the effective size of the channels through the electromagnetically insulating device.

In some embodiments, the EMI attenuation of the electromagnetically insulating device may be further increased by electrically conductive elements positioned in the body material between or around the electrically conductive EMI attenuation layer. In some embodiments, the electrically conductive elements are embedded in the body material and allow electrical conductivity in the plane of the electromagnetically insulating device. In some embodiments, the electrically conductive elements are embedded in the body material and contact one or more of the electrically conductive EMI attenuation layers. In at least one embodiment, the electrically conductive elements are embedded in the body material and contact at least two of the electrically conductive EMI attenuation layers to allow electrical conductivity between the electrically conductive EMI attenuation layers.

In some embodiments, the electrically conductive elements include electrically conductive fibers. In some embodiments, the electrically conductive elements include electrically conductive rods. In some embodiments, the electrically conductive elements include electrically conductive threads.

In some embodiments, as the quantity of the electrically conductive EMI attenuation layer is increased, the electromagnetically insulating device offers additional attenuation for EM radiation wavelengths smaller than the channel size, as the EM radiation must pass through each of the aligned or misaligned channels in the mesh(es) to leak from the electromagnetically insulating device. For example, attenuation may be controlled by the grounding of the electromagnetically insulating device, distance and/or position of the electronic device(s) relative to the electromagnetically insulating device, electromagnetically insulating device configuration, the maximum transverse dimension and longitudinal dimension of the channels, quantity of the channels, frequency, other factors, or combinations thereof.

In some embodiments, the electromagnetically insulating device provides at least −60 dB of attenuation from 9 kHz to 18 GHz. In some embodiments, an electromagnetically insulating device according to the present disclosure attenuates EMI in a frequency range of 2.2 GHz to 2.6 GHz. In other embodiments, an electromagnetically insulating device attenuates EMI in a frequency range of 800 MHz to 900 MHz. In further embodiments, an electromagnetically insulating device attenuates EMI in a frequency range of 1.8 GHz to 2.0 GHz. In yet further embodiments, an electromagnetically insulating device attenuates EMI in a frequency range of 5.0 GHz to 6.0 GHz.

In some embodiments, an electrically conductive EMI attenuation layer provides at least −60 dB of attenuation from 9 kHz to 18 GHz. In some embodiments, an electrically conductive EMI attenuation layer according to the present disclosure attenuates EMI in a frequency range of 2.2 GHz to 2.6 GHz. In other embodiments, an electrically conductive EMI attenuation layer attenuates EMI in a frequency range of 800 MHz to 900 MHz. In further embodiments, an electrically conductive EMI attenuation layer attenuates EMI in a frequency range of 1.8 GHz to 2.0 GHz. In yet further embodiments, an electrically conductive EMI attenuation layer attenuates EMI in a frequency range of 5.0 GHz to 6.0 GHz.

In some embodiments, an electromagnetically insulating device according to the present disclosure attenuates EMI in the frequency range by at least 20 dB of attenuation throughout the frequency range. In other embodiments, an electromagnetically insulating device attenuates EMI in the frequency range by at least 30 dB throughout the frequency range. In yet other embodiments, an electromagnetically insulating device attenuates EMI in the frequency range by at least 60 dB throughout the frequency range.

In some embodiments, an electromagnetically insulating device according to the present disclosure attenuates EMI in the frequency range by an average of at least 20 dB across the frequency range. In other embodiments, an electromagnetically insulating device attenuates EMI in the frequency range by an average of at least 30 dB across the frequency range. In yet other embodiments, an electromagnetically insulating device attenuates EMI in the frequency range by an average of at least 60 dB of attenuation across the frequency range.

In some embodiments, the electrically conductive EMI attenuation layer(s) includes an electrically conductive material. Examples of suitable materials include, but are not limited to copper, aluminum, iron, tin, magnesium, ferrite, or alloys thereof; graphite; and electrically conductive polymers.

In at least one embodiment, an electromagnetically insulating device includes copper to provide both electrical conductivity and flexibility. In another embodiment, an electromagnetically insulating device includes aluminum to provide both electrical conductivity and flexibility. In yet another embodiment, an electromagnetically insulating device includes a combination of copper in a first portion and aluminum in a second portion to provide different electrical conductivity properties in the different portions.

In some embodiments, the first EMI attenuation layer and the second EMI attenuation layer are the same. In some embodiments, the first EMI attenuation layer and the second EMI attenuation layer are different. For example, the first EMI attenuation layer and the second EMI attenuation layer may include or be made of different materials. In another example, the first EMI attenuation layer and the second EMI attenuation layer may have different porosities, such as the first EMI attenuation layer being a mesh and the second EMI attenuation layer being a substantially continuous sheet. In yet another example, the first EMI attenuation layer and the second EMI attenuation layer may have different channel or pore geometries, such as different sizes, shapes, aspect ratios, etc.

The positioning of the EMI attenuation layers may have equal spacing within the electromagnetically insulating device between the first side and the second side. In some embodiments, a total thickness of the electromagnetically insulating device of at least 8 millimeters (mm) allows sufficient electrical separation between the first EMI attenuation layer and the second EMI attenuation layer. In some embodiments, the electromagnetically insulating device has a total thickness of at least 10 mm. In some embodiments, the electromagnetically insulating device has a total thickness of at least 12.7 mm.

In some embodiments, an EMI attenuation layer has an EMI attenuation layer thickness of at least 0.015 mm. For example, an EMI attenuation layer may be a mesh with a wire diameter of 0.015 mm. In a single layer of the EMI attenuation layer, the mesh has an EMI attenuation layer thickness of 0.015 mm. In other embodiments, the EMI attenuation layer has an EMI attenuation layer thickness of at least 0.10 mm. In some examples, increasing the EMI attenuation layer thickness may provide for a EMI attenuation layer with greater electrical conductivity, but the EMI attenuation layer thickness may be less flexible.

In some embodiments, a body layer thickness of the body material between or around the EMI attenuation layer(s) allows flexibility of the electromagnetically insulating device. A second body layer thickness between the EMI attenuation layers, such as between the first EMI attenuation layer and the second EMI attenuation layer, provides a separation between EMI attenuation layers to further aide in EMI attenuation. In some embodiments, body layer thickness is at least 2.5 mm. In some embodiments, at least a second body layer thickness is no less than 2.5 mm to provide a 2.5 mm separation between the first EMI attenuation layer and the second EMI attenuation layer.

In some embodiments, a connection device allows connection of an electromagnetically insulating device, such as any of the embodiments described herein, to a structural element of a structure (e.g., a wall, floor, ceiling, roof, etc.) and/or to another electromagnetically insulating device. For example, the connection device 446 includes a conductive fastener that provides an electrically conductive path from an EMI attenuating layer of the electromagnetically insulating device to an external electrical ground connection. In some embodiments, the external electrical ground connection is provided by a wire provides an electrically conductive path from the connection device to an earth ground. In some embodiments, the external electrical ground connection is provided through a second electromagnetically insulating device that is coupled to an earth ground or other electrical ground.

In some embodiments, the connection device includes a brace. In some embodiments, the brace distributes compressive force from the conductive fastener across at least a portion of an electromagnetically insulating device to prevent and/or limit damage to the electromagnetically insulating device compressed by the brace. In some embodiments, a first brace and a second brace compress one or more electromagnetically insulating devices between the braces. In some embodiments, the connection device includes a first brace to compress the electromagnetically insulating device against a structural element such as a stud or to a concrete wall of a structure.

The conductive fastener, in some embodiments, includes a penetrative tip that allows the conductive fastener to penetrate into a structural element of a structure or into a second brace. In some embodiments, a threaded connection of the conductive fastener allows torque on the conductive fastener to apply a compressive force to the brace(s) by compressing the first brace toward the second brace or be compressing the first brace against a structural element.

In some embodiments, the connection device includes an external brace that is positioned on either side of the electromagnetically insulating devices to connect the electromagnetically insulating devices to one another. As described herein, the conductive fasteners of the connection device may allow electrical conduction between the EMI attenuating layer(s) of a first electromagnetically insulating device to the EMI attenuating layer(s) of a second electromagnetically insulating device. In some embodiments, the brace(s) are electrically conductive to provide a conductive path between a first conductive fasteners coupled to the first electromagnetically insulating device and a second conductive fastener coupled to the second electromagnetically insulating device.

The connection device includes, in some embodiments, a brace that provides a conductive path between a first conductive fastener connected to a first electromagnetically insulating device and a second conductive fastener connected to a second electromagnetically insulating device. In some embodiments, the conductive fasteners compress the brace (and the electromagnetically insulating devices against a structural element, such as a wall.

In some embodiments, an electromagnetically insulating device according to the present disclosure can allow the use of modular systems to electromagnetically insulate buildings such as datacenters from EMI and RF communications, making more sites available and modification of existing sites simpler.

The present disclosure relates to systems and methods for electromagnetic interference (EMI) or radio frequency (RF) shielding according to at least the examples provided in the sections below:

[A1] In some embodiments, an electromagnetically insulating device includes a body material, an electrically conductive EMI attenuation layer, and a plurality of conductive elements. The body material is substantially planar and flexible. The EMI attenuation layer is positioned inside the body material. The plurality of conductive elements are positioned in the body material. The EMI attenuation layer and the plurality of conductive elements are configured to be electrically connected to an external ground connection.

[A2] In some embodiments, the EMI attenuation layer of [A1] is substantially parallel to a plane of the body material.

[A3] In some embodiments, the body material of [A1] or [A2] is watertight.

[A4] In some embodiments, the body material of [A1] or [A2] is airtight.

[A5] In some embodiments, the EMI attenuation layer of any of [A1] through [A4] is a mesh.

[A6] In some embodiments, the plurality of conductive elements of any of [A1] through [A5] includes a plurality of conductive rods.

[A7] In some embodiments, the plurality of conductive elements of any of [A1] through [A5] includes a plurality of conductive fibers.

[A8] In some embodiments, the EMI attenuation layer of any of [A1] through [A7] has a resistance of no more than 5 Ohms.

[A9] In some embodiments, the electromagnetically insulating device of any of [A1] through [A8] provides at least −60 dB of attenuation from 9 kHz through 18 GHz.

[A10] In some embodiments, the EMI attenuation layer of any of [A1] through [A9] provides at least −60 dB of attenuation from 9 kHz through 18 GHz.

[A11] In some embodiments, the electromagnetically insulating device of any of [A1] through [A10] includes a first external ground connector and a second external ground connector that are positioned no more than 18 inches from one another.

[A12] In some embodiments, the body material of any of [A1] through [A11] includes vinyl.

[A13] In some embodiments, the plurality of conductive elements in the body material of any of [A1] through [A12] provide electrical conductivity from the EMI attenuation layer to an external ground connector.

[A14] In some embodiments, the plurality of conductive elements in the body material of any of [A1] through [A13] provide electrical conductivity between the EMI attenuation layer and a second EMI attenuation layer.

[B1] In some embodiments, a system for electromagnetic attenuation includes a first electromagnetically insulating device including a first EMI attenuation layer, a second electromagnetically insulating device including a second EMI attenuation layer, and a connection device electrically connecting the first EMI attenuation layer to the second EMI attenuation layer.

[B2] In some embodiments, the connection device of [B1] includes a first conductive fastener through the first EMI attenuation layer and a second conductive fastener through the second EMI attenuation layer.

[B3] In some embodiments, the connection device of [B2] includes a first brace configured to provide an electrically conductive path from the first conductive fastener to the second conductive fastener.

[B4] In some embodiments, the connection device of [B3] includes a second brace configured to provide an electrically conductive path from the first conductive fastener to the second conductive fastener.

[C1] In some embodiments, an electromagnetically insulating device includes a body material, a first electrically conductive EMI attenuation layer, a second electrically conductive EMI attenuation layer, and a plurality of conductive elements. The body material is substantially planar and flexible. The first EMI attenuation layer is positioned inside the body material. The second EMI attenuation layer is positioned inside the body material. The plurality of conductive elements are positioned in the body material. The first EMI attenuation layer, the second EMI attenuation layer, and the plurality of conductive elements are configured to be electrically connected to an external ground connector.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A system for electromagnetic attenuation, the system comprising:
    a first electromagnetically insulating device including a first EMI attenuation layer, the first electromagnetically insulating device includes a body material and a plurality of conductive elements in the body material, wherein the plurality of conductive elements in the body material provide electrical conductivity from the EMI attenuation layer to an external ground connector or between the EMI attenuation layer and a second EMI attenuation layer;
    a second electromagnetically insulating device including a second EMI attenuation layer; and
    a connection device electrically connecting the first EMI attenuation layer to the second EMI attenuation layer.

2. The system of claim 1, wherein the connection device includes a first conductive fastener through the first EMI attenuation layer and a second conductive fastener through the second EMI attenuation layer.

3. The system of claim 2, wherein the connection device includes a first brace configured to provide an electrically conductive path from the first conductive fastener to the second conductive fastener.

4. The system of claim 3, wherein the connection device includes a second brace configured to provide an electrically conductive path from the first conductive fastener to the second conductive fastener.

5. The system of claim 1, wherein the first EMI attenuation layer is substantially parallel to a plane of a body material of the first electromagnetically insulating device.

6. The system of claim 5, wherein the body material is watertight.

7. The system of claim 5, wherein the body material is airtight.

8. The system of claim 1, wherein the first EMI attenuation layer is a mesh.

9. The system of claim 1, wherein the first EMI attenuation layer and the plurality of conductive elements are configured to be electrically connected to an external ground connector.

10. The system of claim 9, wherein the plurality of conductive elements includes a plurality of conductive rods.

11. The system of claim 9, wherein the plurality of conductive elements includes a plurality of conductive fibers.

12. The system of claim 9, wherein the body material includes vinyl.

13. The system of claim 1, wherein the first EMI attenuation layer has a resistance of no more than 5 Ohms.

14. The system of claim 1, wherein the first electromagnetically insulating device provides at least −60 dB of attenuation from 9 kHz through 18 GHz.

15. The system of claim 14, wherein the first EMI attenuation layer provides at least −60 dB of attenuation from 9 kHz through 18 GHz.

16. The system of claim 1, wherein one or more of the first electromagnetically insulating device or the second electromagnetically insulating device includes a first external ground connector and a second external ground connector that are positioned no more than 18 inches from one another.

17. An electromagnetically insulating device comprising:
    a body material that is substantially planar and flexible;
    a first electromagnetic interference (EMI) attenuation layer positioned inside the body material;
    a second EMI attenuation layer positioned inside the body material and separated from the first EMI attenuation layer by the body material; and
    a plurality of conductive elements in the body material, wherein the first EMI attenuation layer, second EMI attenuation layer, and the plurality of conductive elements are configured to be electrically connected to an external ground connector.

18. The electromagnetically insulating device of claim 17, wherein the first electrically conductive EMI attenuation layer and the second electrically conductive EMI attenuation layer are the same.

19. An electromagnetic interference (EMI) attenuating enclosure comprising:
    a plurality of electromagnetically insulating devices, wherein each of the electromagnetically insulating devices includes:
        a body material;
        a first EMI attenuation layer positioned inside the body material, a second EMI attenuation layer positioned inside the body material and separated from the first EMI attenuation layer by the body material, and a plurality of conductive elements in the body material, wherein the first EMI attenuation layer, second EMI attenuation layer, and the plurality of conductive elements are configured to be electrically connected to an external ground connector; and a plurality of connection devices electrically connecting the plurality of electromagnetically insulating devices to the external ground connector.

20. The EMI attenuating enclosure of claim 19, wherein the plurality of electromagnetically insulating devices is affixed to at least one of a wall, a ceiling, and a floor.

\* \* \* \* \*